(12) United States Patent
Gai et al.

(10) Patent No.: US 10,276,098 B2
(45) Date of Patent: Apr. 30, 2019

(54) PIXEL DRIVING CIRCUIT, ARRAY SUBSTRATE AND DISPLAY APPARATUS

(71) Applicant: BOE TECHNOLOGY GROUP CO., LTD., Beijing (CN)

(72) Inventors: Cuili Gai, Beijing (CN); Kun Cao, Beijing (CN); Baoxia Zhang, Beijing (CN); Yongqian Li, Beijing (CN); Quanhu Li, Beijing (CN); Longyan Wang, Beijing (CN); Jingwen Yin, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 62 days.

(21) Appl. No.: 15/116,624

(22) PCT Filed: Oct. 30, 2015

(86) PCT No.: PCT/CN2015/093393
§ 371 (c)(1),
(2) Date: Aug. 4, 2016

(87) PCT Pub. No.: WO2016/197525
PCT Pub. Date: Dec. 15, 2016

(65) Prior Publication Data
US 2017/0148388 A1  May 25, 2017

(30) Foreign Application Priority Data
Jun. 10, 2015  (CN) .......................... 2015 1 0317207

(51) Int. Cl.
*G09G 3/3258* (2016.01)
*G09G 3/3233* (2016.01)
(Continued)

(52) U.S. Cl.
CPC ......... *G09G 3/3258* (2013.01); *G09G 3/3233* (2013.01); *G09G 3/3266* (2013.01);
(Continued)

(58) Field of Classification Search
CPC ........ H01L 27/32–27/3297; G09G 2300/0819; G09G 2320/043; G09G 2300/0809;
(Continued)

(56) References Cited

U.S. PATENT DOCUMENTS

2010/0259531 A1* 10/2010 Ono ..................... G09G 3/3233
345/212
2011/0063266 A1  3/2011 Chung et al.
(Continued)

FOREIGN PATENT DOCUMENTS

CN  102411893 A  4/2012
CN  103021331 A  4/2013
(Continued)

OTHER PUBLICATIONS

International Search Report of PCT/CN2015/093393 in Chinese, dated Mar. 17, 2016 with English translation.
(Continued)

*Primary Examiner* — Sanjiv D. Patel
(74) *Attorney, Agent, or Firm* — Collard & Roe, P.C.

(57) ABSTRACT

There are provided in the present disclosure a pixel driving circuit, an array substrate and a display apparatus. The pixel driving circuit comprises: a compensation module (11), a control module (12), a driving modeling (13), and a light emitting module (14), wherein: the compensation module (11) is connected to a scan signal (Scan), a data signal (Vdata) and a reference signal (VREF) and further connected to the control module (12) and the drive module (13), and is configured to receive the data signal (Vdata) and the reference signal (VREF) under the control of the scan signal
(Continued)

(Scan) and compensate for a threshold voltage of the drive module (13) under the control of the control module (12); the control module (12) is connected to a light emitting control signal (EM) and a power supply signal (ELVDD) and further connected to the drive module (13) and the light emitting module (14), and is configured to receive the power supply signal (ELVDD) under the control of the light emitting control signal (EM) to control the compensation module (11) to compensate for the threshold voltage of the drive module (13); one terminal of the light emitting module (14) is connected to the drive module (13), and the other terminal thereof is grounded (VSS); and; the drive module (13) is configured to drive the light emitting module (14) to emit light under the control of the control module (12). The pixel driving circuit is capable of avoiding non-uniformity of luminance of the display device, and enhancing the display effect of the display device.

19 Claims, 3 Drawing Sheets

(51) Int. Cl.
  *G09G 3/3266* (2016.01)
  *G09G 3/3291* (2016.01)
  *H01L 27/12* (2006.01)
  *H01L 27/32* (2006.01)
(52) U.S. Cl.
  CPC ....... *G09G 3/3291* (2013.01); *H01L 27/1255* (2013.01); *H01L 27/3248* (2013.01); *H01L 27/3276* (2013.01); *G09G 2300/0426* (2013.01); *G09G 2300/0819* (2013.01); *G09G 2300/0852* (2013.01); *G09G 2300/0861* (2013.01); *G09G 2320/0233* (2013.01); *G09G 2320/045* (2013.01); *G09G 2320/0626* (2013.01)
(58) Field of Classification Search
  CPC ..... G09G 2310/0251; G09G 2310/061; G09G 2320/0295; G09G 2320/045; G09G 3/30; G09G 3/3258; G09G 3/3233; G09G 2300/0861; G09G 2320/0233
  See application file for complete search history.

(56) References Cited

U.S. PATENT DOCUMENTS

| | | |
|---|---|---|
| 2011/0074757 A1 | 3/2011 | Chung et al. |
| 2011/0090202 A1 | 4/2011 | Han |
| 2012/0169574 A1* | 7/2012 | Kim ..................... G09G 3/3233 345/76 |
| 2014/0152191 A1 | 6/2014 | Yang et al. |
| 2014/0313241 A1* | 10/2014 | Ono ..................... G09G 3/3233 345/691 |
| 2015/0371586 A1* | 12/2015 | Chen ..................... G09G 3/3258 345/78 |
| 2015/0371587 A1* | 12/2015 | Chen ..................... G09G 3/3233 345/76 |
| 2016/0035276 A1 | 2/2016 | Yin et al. |
| 2016/0125796 A1* | 5/2016 | Ohara ..................... G09G 3/30 345/211 |
| 2016/0240136 A1 | 8/2016 | Han |

FOREIGN PATENT DOCUMENTS

| | | |
|---|---|---|
| CN | 203179476 U | 9/2013 |
| CN | 103700342 A | 4/2014 |
| CN | 103996379 A | 8/2014 |
| CN | 104167168 A | 11/2014 |
| CN | 104882099 A | 9/2015 |

OTHER PUBLICATIONS

Notice of Transmittal of the International Search Report of PCT/CN2015/093393 in Chinese, dated Mar. 17, 2016.
Written Opinion of the International Searching Authority of PCT/CN2015/093393 in Chinese, dated Mar. 17, 2016 with English translation.
Chinese Office Action in Chinese Application No. 201510317207.6, dated Dec. 23, 2016 with English translation.

* cited by examiner

PIXEL DRIVING CIRCUIT, ARRAY SUBSTRATE AND DISPLAY APPARATUS

CROSS REFERENCE TO RELATED APPLICATIONS

This application is the National Stage of PCT/CN2015/093393 filed on Oct. 30, 2015, which claims priority under 35 U.S.C. § 119 of Chinese Application No. 201510317207.6 filed on Jun. 10, 2015, the disclosure of which is incorporated by reference.

TECHNICAL FIELD

The present disclosure relates to a pixel driving circuit, an array substrate and a display apparatus.

BACKGROUND

As a current-mode light emitting device, an organic light emitting diode (referred to as OLED) is increasingly applied to a high-performance display field due to its characteristics of self-luminescent, fast response, wide viewing angle and available to be manufactured on a flexible substrate, etc. The OLED can be divided into two kinds of a passive matrix driving OLED (referred to as PMOLED) and an active matrix driving OLED (referred to as AMOLED) according to driving modes. As the display apparatus increases in size, a conventional PMOLED needs to reduce driving time of a single pixel, and thereby it needs to increase transient current, thus resulting in a rise of power consumption; at the same time, it would make an operating voltage of OLED become over high, thereby causing a decrease of working efficiency. Whereas in AMOLED technique, each OLED scans input current through a thin film transistor (referred to as TFT) switching circuit progressively, this can solve the above problem well.

In the existing AMOLED panel, the TFT switching circuit adopts mostly a low temperature poly silicon thin film transistor (LTPS TFT) or an oxide thin film transistor (Oxide TFT). Compared with a common amorphous-silicon thin film transistor (amorphous-Si TFT), LTPS TFT and Oxide TFT have higher mobility rate and more stable characteristics, and are more suitable for being applied in AMOLED display. However, due to limitations of crystallization process and production level, non-uniformity in electrical parameters such as threshold voltage and mobility rate and so on always occurs to the TFT switching circuits manufactured on a large-size glass substrate, such that threshold voltage offset of respective TFTs is inconsistent; in addition, under long-time pressure and high temperature, it would also cause occurrence of the threshold voltage drift of the TFT. Threshold drift of TFTs in different parts of the panel would be different because of different display pictures, thereby causing differences in display luminance. As a result, phenomenon of image sticking would occur. Further, it would cause the current for driving a diode unstable, thereby causing luminance difference of OLED display devices, such that the problem of non-uniformity of luminance would occur, and the display effect of a display device would be influenced.

SUMMARY

There are provided in embodiments of the present disclosure a pixel driving circuit, an array substrate and a display apparatus.

There is provided in a first aspect of the present disclosure a pixel driving circuit, comprising: a compensation module, a control module, a drive module, and a light emitting module, wherein:

the compensation module is connected to a scan signal, a data signal and a reference signal and further connected to the control module and the drive module, and is configured to receive the data signal and the reference signal under the control of the scan signal and compensate for a threshold voltage of the drive module under the control of the control module;

the control module is connected to a light emitting control signal and a power supply signal and further connected to the drive module and the light emitting module, and is configured to receive the power supply signal under the control of the light emitting control signal to control the compensation module to compensate for the threshold voltage of the drive module;

one terminal of the light emitting module is connected to the drive module, and the other terminal thereof is connected to a ground; and the drive module is configured to drive the light emitting module to emit light under the control of the control module.

Optionally, the compensation module comprises:

a first transistor, whose gate is connected to the scan signal, first electrode is connected to the data signal, and second electrode is connected to the control module;

a second transistor, whose gate is connected to the scan signal, first electrode is connected to the reference signal, and second electrode is connected to a second terminal of a first capacitor;

the first capacitor, whose first terminal is connected to the second electrode of the first transistor;

a second capacitor, whose first terminal is connected to the second electrode of the second transistor, and second terminal is connected to a second electrode of a third transistor; and the third transistor, whose gate is connected to the scan signal, first electrode is connected to the control module and the drive module, and second electrode is connected to the drive module.

Optionally, the control module comprises:

a fourth transistor, whose gate is connected to the light emitting control signal, first electrode is connected to the power supply signal, and second electrode is connected to the drive module and the compensation module; and a sixth transistor, whose gate is connected to the light emitting control signal, first electrode is connected to the compensation module, and second electrode is connected to the drive module and the light emitting module.

Optionally, the drive module comprises: a fifth transistor, wherein:

a gate of the fifth transistor is connected to the compensation module, a first electrode thereof is connected to the compensation module and the control module, and second electrode thereof is connected to the control module and the light emitting module.

Optionally, the light emitting module comprises: an organic light emitting diode, wherein:

an input terminal of the organic light emitting diode is connected to the control module and the drive module, and an output terminal thereof is connected to a ground.

Optionally, the first transistor, the second transistor and the third transistor are N-type transistors simultaneously or P-type transistors simultaneously.

Optionally, the fourth transistor and the sixth transistor are N-type transistors simultaneously or P-type transistors simultaneously.

Optionally, the fifth transistor is N-type transistor.

There is provided in a second aspect of the present disclosure an array substrate, comprising the pixel driving circuit as described in the first aspect.

There is provided in a third aspect of the present disclosure a display apparatus, comprising the array substrate as described in the second aspect.

In the pixel driving circuit, the array substrate and the display apparatus provided in the embodiments of the present disclosure, the data signal and the reference signal are received by the compensation module under the control of the scan signal, and the power supply signal is received by the control module under the control of the light emitting control signal. The pixel driving circuit, the array substrate and the display apparatus realize that the control module controls the compensation module to compensate for the threshold voltage of the drive transistor, solves the problem of current difference caused by instability of the threshold voltage of the drive transistor, avoids the problem of occurrence of luminance non-uniformity of the display device, and raises the display effect of the display device.

DETAILED DESCRIPTION

Technical solutions in embodiments of the present disclosure will be described clearly and completely by combining with figures. Obviously, the embodiments described below are just a part of embodiments of the present disclosure, but not all of embodiments. Based on the embodiments in the present disclosure, all of other embodiments obtained by those ordinary skilled in the art without paying any inventive labor belong to the scope sought for protection in the present disclosure.

Figure 1:
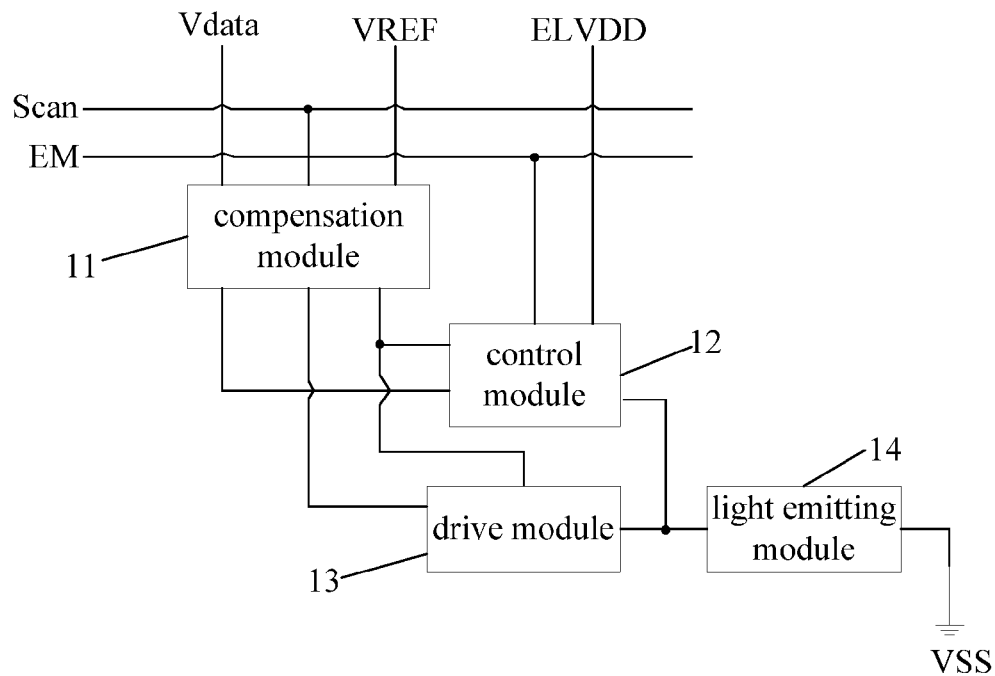
FIG. 1 is a schematic diagram of a structure of a pixel driving circuit provided in an embodiment of the present disclosure.

FIG. 1 shows a pixel driving circuit provided in an embodiment of the present disclosure. Referring to FIG. 1, the pixel driving circuit comprises: a compensation module 11, a control module 12, a drive module 13, and a light emitting module 14.

In the circuit as shown in FIG. 1, the compensation module 11 is connected to a scan signal Scan, a data signal Vdata and a reference signal VREFF, and is further connected to the control module 12 and the drive module 13.

The control module 12 is connected to a light emitting control signal EM and a power supply signal ELVDD, and is further connected to the drive module 13 and the light emitting module 14.

One terminal of the light emitting module 14 is connected to the drive module 13, and the other terminal thereof is connected to a ground.

The compensation module 11 is configured to receive the data signal Vdata and the reference signal VREFF under the control of the scan signal Scan and compensate for the threshold voltage of the drive module 13 under the control of the control module.

The control module 12 is used to receive the power supply signal ELVDD under the control of the light-emitting control signal EM and control the compensation module to compensate for the threshold voltage of the drive module.

The drive module 13 is configured to drive the light emitting module 14 to emit light under the control of the control module 12.

In the pixel driving circuit provided in the embodiment of the present disclosure, the data signal and the reference signal are received by the compensation module under the control of the scan signal, and the power supply signal is received by the control module under the control of the light emitting control signal. Thus, it is realized that the control module controls the compensation module to compensate for the threshold voltage of the drive transistor thereby the problem of current difference caused by instability of the threshold voltage of the drive transistor is solved, the problem of occurrence of the non-uniformity of luminance of the display device is avoided, and the display effect of the display device is enhanced.

Figure 2:
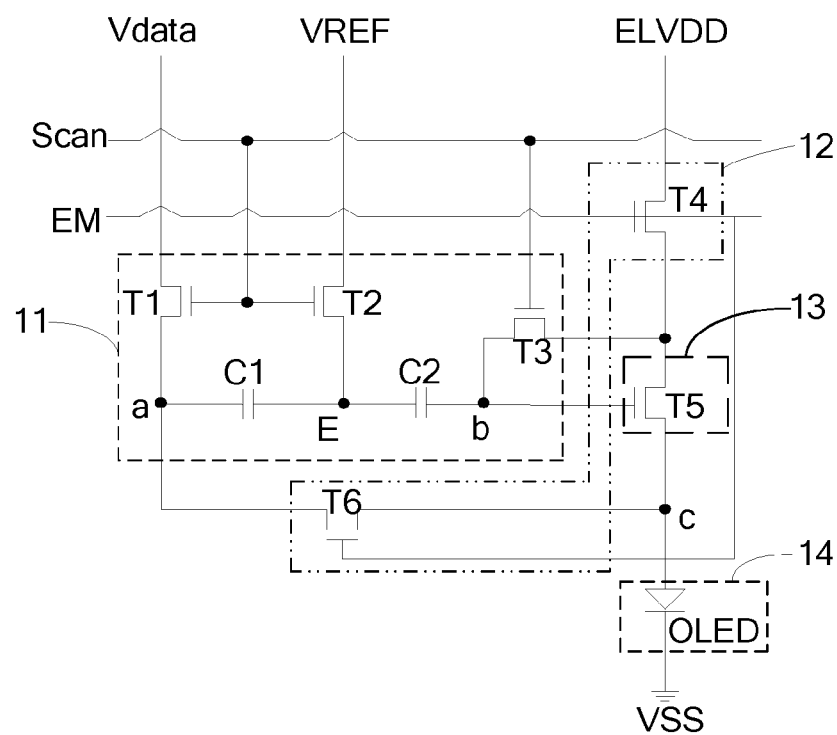
FIG. 2 is a schematic diagram of a structure of a pixel driving circuit provided in an embodiment of the present disclosure.

FIG. 2 is a schematic diagram of another pixel driving circuit provided in an embodiment of the present disclosure. As shown in FIG. 2, the compensation module 11 comprises: a first transistor T1, a second transistor T2, a third transistor T3, a first capacitor C1 and a second capacitor C2.

In the circuit as shown in FIG. 2, a gate of the first transistor T1 is connected to the scan signal Scan, a first electrode thereof is connected to the data signal Vdata, and second electrode thereof is connected to the control module 12.

A gate of the second transistor T2 is connected to the scan signal Scan, a first electrode thereof is connected to the reference signal VREFF, and a second electrode thereof is connected to a second terminal of the first capacitor C1.

A first terminal of the first capacitor C1 is connected to the second electrode of the first transistor T1.

A first terminal of the second capacitor C2 is connected to the second electrode of the second transistor T2, and a second terminal thereof is connected to a second electrode of the third transistor T3.

A gate of the third transistor T3 is connected to the scan signal Scan, a first electrode thereof is connected to the control module 12 and the drive module 13, and a second electrode thereof is connected to the drive module 13.

Further, as shown in FIG. 2, the control module 12 can comprise: a fourth transistor T4 and a sixth transistor T6.

A gate of the fourth transistor T4 is connected to the light emitting control signal EM, a first electrode thereof is connected to the power supply signal ELVDD, and a second electrode thereof is connected to the drive module 13 and the compensation module 11.

A gate of the sixth transistor T6 is connected to the light emitting control signal EM, a first electrode thereof is connected to the compensation module 11, and a second electrode thereof is connected to the drive module 13 and the light emitting module 14.

Further, as shown in FIG. 2, the drive module 13 can comprise: a fifth transistor T5.

A gate of the fifth transistor T5 is connected to the compensation module 11, a first electrode thereof is connected to the compensation module 11 and the control module 12, and a second electrode thereof is connected to the control module 12 and the light emitting module 14.

As shown in FIG. 2, the light emitting module 14 can comprise: an organic light emitting diode OLED.

An input terminal of the organic light emitting diode OLED is connected to the control module 12 and the drive module 13, and an output terminal thereof is connected to a ground VSS.

As shown in FIG. 2, the second electrode of the first transistor can be connected to the first electrode of the sixth transistor; the first electrode of the third transistor can be connected to the second electrode of the fourth transistor; the first electrode of the fifth transistor can be connected to the second electrode of the fourth transistor, and the second electrode thereof is connected to the input terminal of the organic light emitting diode; the second electrode of the sixth transistor can be connected to the second electrode of the fifth transistor.

Exemplarily, the first transistor T1, the second transistor T2 and the third transistor T3 in the compensation module 11 can belong to transistors of a same type. For example, T1, T2 and T3 can be N-type transistors simultaneously or P-type transistors simultaneously.

The fourth transistor T4 and the sixth transistor T6 in the control module 12 can belong to transistors of a same type. For example, T4 and T6 can be N-type transistors simultaneously or P-type transistors simultaneously.

The fifth transistor T5 can be the N-type transistor.

The transistors adopted in all of embodiments of the present disclosure can be thin film transistors or field effect transistors or other devices having same characteristics. Since sources and drains of the transistors adopted herein are symmetrical, their sources and drains can be exchanged with each other. In the embodiments of the present disclosure, in order to distinguish two electrodes other than a gate of a transistor, one electrode is referred to as a source while the other electrode is referred to as a drain. In addition, the transistors adopted in the embodiments of the present disclosure comprise two types of transistors, i.e., P-type and N-type.

Figure 3:
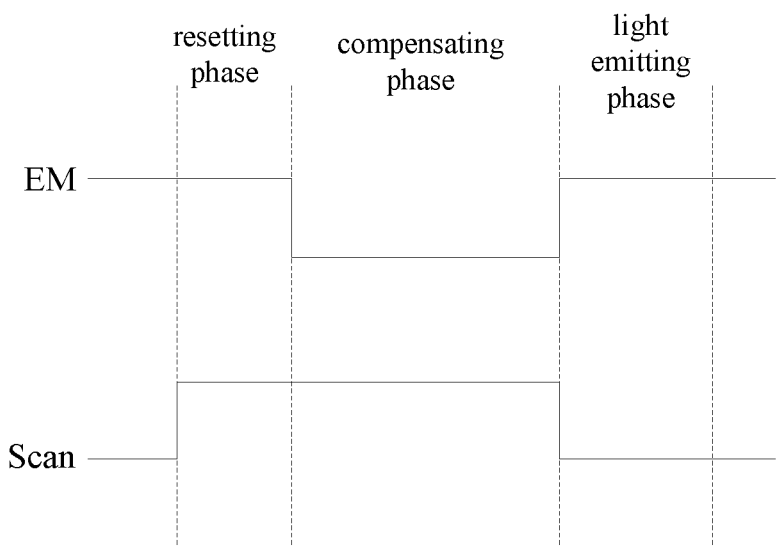
FIG. 3 is an operation timing diagram of a pixel driving circuit provided in an embodiment of the present disclosure.

Description is given below by taking the first transistor T1, the second transistor T2, the third transistor T3, the fourth transistor T4, the fifth transistor T5 and the sixth transistor T6 being N-type transistors and the fifth transistor T5 being a drive transistor as an example. As shown in FIG. 2, in order to facilitate understanding, the first terminal of the first capacitor C1 is defined as a node a, the second terminal of the first capacitor C1 and the first terminal of the second capacitor C2 are defined as a node E, the second terminal of the second capacitor C2 is defined as a node b, and the input terminal of the organic light emitting diode is defined as a node c. At this time, an operation timing diagram of the pixel driving circuit is as shown in FIG. 3. The operating process of the pixel driving circuit can comprise three phases: a resetting phase, a compensating phase and a light emitting phase. Respective operating phases of the pixel driving circuit will be described below in detail.

Resetting is as shown in FIG. 3, in a first phase, i.e., the resetting phase, both the scan signal Scan and the light emitting control signal EM are at a high level. An equivalent circuit diagram of the pixel driving circuit in the resetting phase in the embodiment of the present disclosure is as shown in FIG. 2. Now, the first transistor T1, the second transistor T2, the third transistor T3, the fourth transistor T4, the drive transistor T5 and the sixth transistor T6 are all turned on. A voltage of the first terminal of the first capacitor C1, i.e., a voltage of the node a, is a voltage Vdata of the data signal, a voltage of the second terminal of the first capacitor C1 and the first terminal of the second capacitor C2, i.e., a voltage of the node E, is a voltage VREFF of the reference signal, and a voltage of the second terminal of the second capacitor C2, i.e., the voltage of the node b, is the power supply signal voltage ELVDD. Therefore, it is realized that the voltage of the two terminals of the first capacitor C1 and the second capacitor C2 and the voltage of the gate of the drive transistor T5 are reset, so that an operating process in a next period is not influenced by a voltage signal produced in an operating process of a previous period, which avoids the problem of imaging sticking from occurring.

Figure 4:
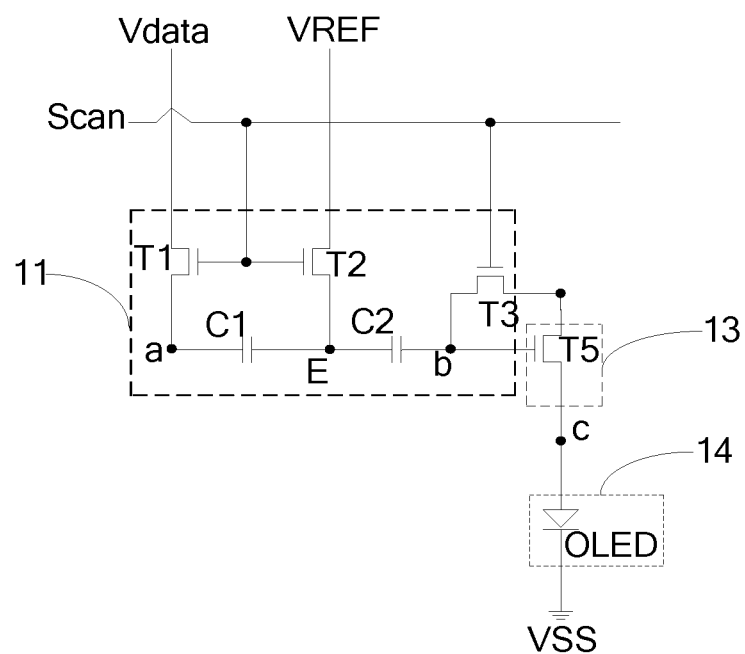
FIG. 4 is a schematic diagram of a structure of an equivalent circuit of a pixel driving circuit in a compensation phase provided in an embodiment of the present disclosure.

In a second phase, i.e., the compensating phase, as shown in FIG. 3, the scan signal Scan is at the high level, and the light emitting control signal EM is at a low level. An equivalent circuit diagram of the pixel driving circuit in the compensating phase in the embodiment of the present disclosure is as shown in FIG. 4. Now, the first transistor T1, the second transistor T2, the third transistor T3 and the drive transistor T5 are turned on; and the fourth transistor T4 and the sixth transistor T6 are turned off. Since the third transistor T3 is turned on, the fifth transistor T5 is equivalent to a node PN, because the voltage of the node c is Voled0. Now, the voltage of the node b changes into Voled0+Vth, where Voled0 is an initial voltage of the organic light emitting diode, Vth is the threshold voltage of the drive transistor. Therefore, when the compensating phase ends, the voltage of the first terminal of the first capacitor C1, i.e., the voltage of the node a, is Vdata, the voltage of the second terminal of the first capacitor C1 and the voltage of the first terminal of the second capacitor C2, i.e., the voltage of the node E, is VREFF, and the voltage of the second terminal of the second capacitor C2, i.e., the voltage of the node b, is Voled0+Vth. Now, a voltage difference between the two terminals of the first capacitor C1 is Vdata−VREF, and a voltage different between the two terminals of the second capacitor C2 is VREF−Voled0−Vth.

Figure 5:
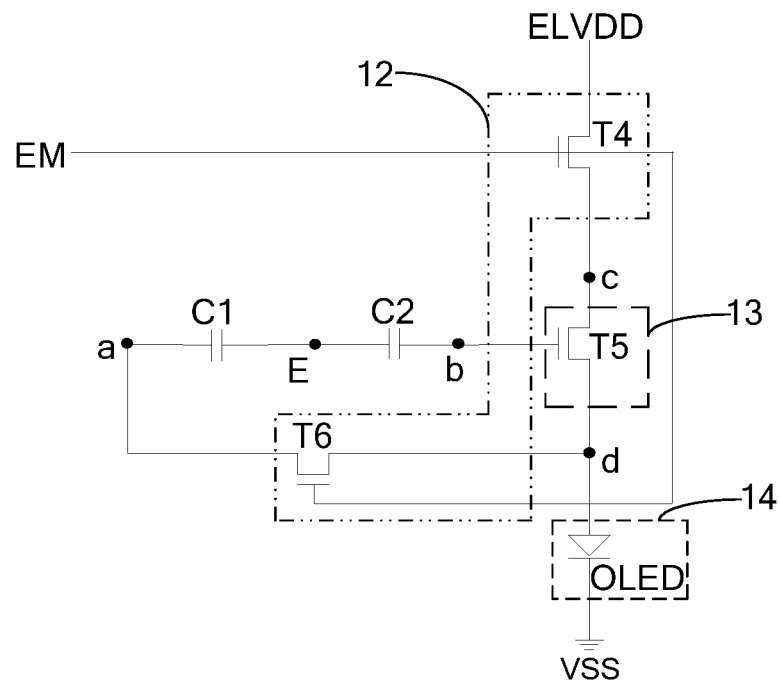
FIG. 5 is a schematic diagram of a structure of an equivalent circuit of a pixel driving circuit in a light emitting phase provided in an embodiment of the present disclosure.

In a third phase, i.e., the light emitting phase, as shown in FIG. 3, the scan signal Scan is at the low level, and the light emitting control signal EM is at the high level. An equivalent circuit diagram of the pixel driving circuit in the light emitting phase in the embodiment of the present disclosure is as shown in FIG. 5. Now, the first transistor T1, the second transistor T2 and the third transistor T3 are turned off; the fourth transistor T4, the drive transistor T5 and the sixth transistor T6 are turned on; the drive transistor T5 drives the organic light emitting diode OLED to emit light, and the voltage of the node c is Voled1, where Voled1 is an operating voltage of the organic light emitting diode; therefore, the voltage of the node a changes into Voled1. Due to existence of bootstrap effect of the first capacitor C1 and the second capacitor C2, the value of the voltage difference between the two terminals of the first capacitor C1 and the second capacitor C2 maintains unchanged, and at the same time, the value of the voltage difference between the two terminals of the first capacitor C1 in the compensating phase is Vdata−VREFF, and thus the voltage of the node E is Voled1+VREF−Vdata; while the value of the voltage difference between the two terminals of the second capacitor C2 in the compensating phase is VREF−Voled0−Vth, and thus the voltage of the node b is Voled1+Voled0+Vth−Vdata; finally, an over driving voltage of the drive transistor T5 is Voled1+Voled0+Vth−Vdata−Voled1−Vth; therefore, the current of the suppressed current drive transistor T5 is:

$$I = \frac{1}{2}\mu_n \times Cox \times \frac{W}{L} \times [Voled0 + Vth + Voled1 - Vdata - Volde1 - Vth]^2$$
$$= \frac{1}{2}\mu_n \times Cox \times \frac{W}{L} \times [Voled0 - Vdata]^2$$

In this way, it can be obtained evidently that the value of the current flowing through the drive transistor T5 after going through the light emitting phase is only related with the initial voltage of the organic light emitting diode and the voltage of the data signal, while it is unrelated with the threshold voltage of the drive transistor and the operating voltage of the organic light emitting diode. Therefore, influence of the threshold voltage on the current flowing through the organic light emitting diode is eliminated. At the same time, it may avoid the instability of the operating voltage Voled1 of the OLED caused by non-uniformity of the organic light emitting diode from influencing the current, and thus avoid the problem of current difference.

Figure 6:
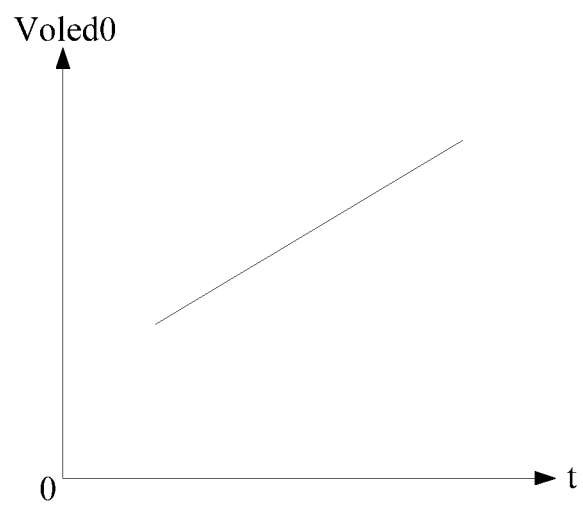
FIG. 6 is a characteristic curve diagram of an initial voltage of an organic light emitting diode in a pixel driving circuit provided an embodiment of the present disclosure.

Further, FIG. 6 shows a characteristic curve diagram of an initial voltage of an organic light emitting diode in the pixel driving circuit in an embodiment of the present disclosure. As shown in FIG. 6, its horizontal axis represents the use time of the organic light emitting diode OLED, and its vertical axis represents a size of the initial voltage Voled0 of the organic light emitting diode. The initial voltage Voled0 of the organic light emitting diode becomes large gradually with the use time of OLED. Therefore, with the aging of the OLED, the current flowing through the light emitting diode OLED in the pixel driving circuit of the present disclosure increases gradually, which provides a good solution to the problem of luminance attenuation of the display device caused by the aging of the OLED, so that the service life of the organic light emitting diode OLED can be increased in the case of ensuring the stable current.

It needs to note that, in order to further increase the current of the organic light emitting diode and raise the display luminance of the display device, the present disclosure can use exemplarily a data signal that is capable of providing a negative value. Of course, the embodiment of the present disclosure just takes the first transistor T1, the second transistor T2, the third transistor T3, and the fourth transistor T4, the fifth transistor T5 and the sixth transistor T6 being N-type transistors as an example, but does not limit that the above transistors can be only the N-type transistors, so that transistors satisfy the specific principle can be selected according to the specific requirement in the actual application; if the first transistor T1, the second transistor T2, the third transistor T3, the fourth transistor T4, the fifth transistor T5 and the sixth transistor T6 are P-type transistors, then the operation timing diagram of the pixel driving circuit is exactly opposite to the timing diagram as shown in FIG. 3. Other cases can be designed according to the specific requirement.

In the pixel driving circuit provided in the embodiments of the present disclosure, the data signal and the reference signal are received by the compensation module under the control of the scan signal, and the power supply signal is received by the control module under the control of the light emitting control signal. The pixel driving circuit realizes that the control module controls the compensation module to compensate for the threshold voltage of the drive transistor, solves the problem of current difference caused by instability of the threshold voltage of the drive transistor, avoids the problem of occurrence of luminance non-uniformity of the display device, and raises the display effect of the display device.

There is provided in an embodiment of the present disclosure an array substrate, comprising the pixel driving circuit in the above embodiment. Herein, the pixel driving circuit is the same as the above embodiment, and thus no further description is provided herein. Additionally, the structure of other parts of the array substrate can refer to the prior art, and thus no further detailed description is given herein.

In the array substrate provided in the embodiment of the present disclosure, the data signal and the reference signal are received by the compensation module under the control of the scan signal in the pixel driving circuit of the array substrate, and the power supply signal is received by the control module under the control of the light emitting control signal. The array substrate realizes that the control module controls the compensation module to compensate for the threshold voltage of the drive transistor, solves the problem of current difference caused by instability of the threshold voltage of the drive transistor, avoids the problem of occurrence of luminance non-uniformity of the display device, and raises the display effect of the display device.

There is provided in an embodiment of the present disclosure a display apparatus, comprising the array substrate in the embodiment described above. Herein, the array substrate is the same as the embodiment described above, and thus no further description is given herein. Additionally, the structure of other parts of the display apparatus can refer to the prior art, and thus no further detailed description is given herein. The display apparatus may be a product or elements having the display function, such as a computer display, a television display screen, a digital framework, a mobile phone and a table computer and so on, to which the embodiment of the present disclosure does not limit particularly.

In the display apparatus provided in the embodiments of the present disclosure, the data signal and the reference signal are received by the compensation module under the control of the scan signal in the pixel driving circuit of the display apparatus, and the power supply signal is received by the control module under the control of the light emitting control signal. It is realized that the control module controls the compensation module to compensate for the threshold voltage of the drive transistor, solves the problem of current difference caused by instability of the threshold voltage of the drive transistor, avoids the problem of occurrence of luminance non-uniformity of the display device, and raises the display effect of the display device.

Those ordinary skilled in the art can understand that, all or part of steps that implement the method embodiment described above can be accomplished by program structure-related hardware. The program described above can be stored in a computer readable storage medium. When this program is executed, the steps comprising the above method embodiments are executed. The storage medium comprises various media such as ROM, RAM, a magnetic disk or an optical disk that can store program codes.

The above descriptions are just specific implementations of the present disclosure, but the protection scope of the present disclosure is not limited thereto. Any alternation or replacement that can be easily conceived by those skilled in the art who are familiar with the present technical field within the technical scope of the present disclosure shall be covered within the protection scope of the present disclosure. Therefore, the protection scope of the present disclosure shall be subjected to the protection scope of the Claims.

The present application claims the priority of a Chinese patent application No. 201510317207.6 filed on Jun. 10, 2015. Herein, the content disclosed by the Chinese patent application is incorporated in full by reference as a part of the present disclosure.

What is claimed is:

1. A pixel driving circuit, comprising: a compensation module, a control module, a driving modeling, and a light emitting module, wherein:
the compensation module is connected with a scan signal, a data signal and a reference signal and further connected to the control module and the drive module, and is configured to receive the data signal and the reference signal under the control of the scan signal and compensate for a threshold voltage of the drive module under the control of the control module, wherein the compensation module comprises:
a first transistor, whose gate is connected to the scan signal, first electrode is connected to the data signal, and second electrode is connected to the control module;
a second transistor, whose gate is connected to the scan signal, first electrode is connected to the reference signal, and second electrode is connected to a second terminal of a first capacitor;
the first capacitor, whose first terminal is connected to the second electrode of the first transistor;
a second capacitor, whose first terminal is connected to the second electrode of the second transistor and the first terminal of the first capacitor, and second terminal is connected to a second electrode of a third transistor; and
the third transistor, whose gate is connected to the scan signal, first electrode is connected to the control module and the drive module, and second electrode is connected to the drive module;
the control module is connected with a light emitting control signal different from the scan signal and a power supply signal and further connected to the drive module and the light emitting module, and is configured to receive the power supply signal under the control of the light emitting control signal and control the compensation module to compensate for the threshold voltage of the drive module;
one terminal of the light emitting module is connected to the drive module, and the other terminal thereof is connected to a ground; and
the drive module is configured to drive the light emitting module to emit light under the control of the control module,
wherein compensating for the threshold voltage of the drive module comprising:
in a resetting phase, both the scan signal and the light emitting control signal being at a high level;
in a compensating phase, the scan signal being at the high level, and the light emitting control signal being at a low level; and
in a light emitting phase, the scan signal being at the low level, and the light emitting control signal being at the high level.

2. The pixel driving circuit according to claim 1, wherein the control module comprises:

a fourth transistor, whose gate is connected to the light emitting control signal, first electrode is connected to the power supply signal, and second electrode is connected to the drive module and the compensation module; and
a sixth transistor, whose gate is connected to the light emitting control signal, first electrode is connected to the compensation module, and second electrode is connected to the drive module and the light emitting module.

3. The pixel driving circuit according to claim 1, wherein the drive module comprises: a fifth transistor, wherein:
a gate of the fifth transistor is connected to the compensation module, a first electrode thereof is connected to the compensation module and the control module, and a second electrode thereof is connected to the control module and the light emitting module.

4. The pixel driving circuit according to claim 1, wherein the light emitting module comprises: an organic light emitting diode, wherein:
one terminal of the organic light emitting diode is connected to the control module and the drive module, and another terminal thereof is grounded.

5. The pixel driving circuit according to claim 1, wherein the first transistor, the second transistor and the third transistor are N-type transistors simultaneously or P-type transistors simultaneously.

6. The pixel driving circuit according to claim 2, wherein the fourth transistor and the sixth transistor are N-type transistors simultaneously or P-type transistors simultaneously.

7. The pixel driving circuit according to claim 3, wherein the fifth transistor is the N-type transistor.

8. An array substrate, comprising the pixel driving circuit according to claim 1.

9. A display apparatus, comprising the array substrate according to claim 8.

10. The array substrate according to claim 8, wherein the compensation module comprises:
a first transistor, whose gate is connected to the scan signal, first electrode is connected to the data signal, and second electrode is connected to the control module;
a second transistor, whose gate is connected to the scan signal, first electrode is connected to the reference signal, and second electrode is connected to a second terminal of a first capacitor;
the first capacitor, whose first terminal is connected to the second electrode of the first transistor;
a second capacitor, whose first terminal is connected to the second electrode of the second transistor, and second terminal is connected to a second electrode of a third transistor; and
the third transistor, whose gate is connected to the scan signal, first electrode is connected to the control module and the drive module, and second electrode is connected to the drive module.

11. The array substrate according to claim 8, wherein the control module comprises:
a fourth transistor, whose gate is connected to the light emitting control signal, first electrode is connected to the power supply signal, and second electrode is connected to the drive module and the compensation module; and
a sixth transistor, whose gate is connected to the light emitting control signal, first electrode is connected to the compensation module, and second electrode is connected to the drive module and the light emitting module.

12. The array substrate according to claim 8, wherein the drive module comprises: a fifth transistor, wherein:
a gate of the fifth transistor is connected to the compensation module, a first electrode thereof is connected to the compensation module and the control module, and a second electrode thereof is connected to the control module and the light emitting module.

13. The array substrate according to claim 8, wherein the light emitting module comprises: an organic light emitting diode, wherein:
one terminal of the organic light emitting diode is connected to the control module and the drive module, and another terminal thereof is grounded.

14. The array substrate according to claim 10, wherein the first transistor, the second transistor and the third transistor are N-type transistors simultaneously or P-type transistors simultaneously.

15. The array substrate according to claim 11, wherein the fourth transistor and the sixth transistor are N-type transistors simultaneously or P-type transistors simultaneously.

16. The array substrate according to claim 12, wherein the fifth transistor is the N-type transistor.

17. The display apparatus according to claim 9, wherein the compensation module comprises:
a first transistor, whose gate is connected to the scan signal, first electrode is connected to the data signal, and second electrode is connected to the control module;
a second transistor, whose gate is connected to the scan signal, first electrode is connected to the reference signal, and second electrode is connected to a second terminal of a first capacitor;
the first capacitor, whose first terminal is connected to the second electrode of the first transistor;
a second capacitor, whose first terminal is connected to the second electrode of the second transistor, and second terminal is connected to a second electrode of a third transistor; and
the third transistor, whose gate is connected to the scan signal, first electrode is connected to the control module and the drive module, and second electrode is connected to the drive module.

18. The display apparatus according to claim 9, wherein the control module comprises:
a fourth transistor, whose gate is connected to the light emitting control signal, first electrode is connected to the power supply signal, and second electrode is connected to the drive module and the compensation module; and
a sixth transistor, whose gate is connected to the light emitting control signal, first electrode is connected to the compensation module, and second electrode is connected to the drive module and the light emitting module.

19. The display apparatus according to claim 9, wherein the drive module comprises: a fifth transistor, wherein:
a gate of the fifth transistor is connected to the compensation module, a first electrode thereof is connected to the compensation module and the control module, and a second electrode thereof is connected to the control module and the light emitting module.

* * * * *